(12) United States Patent
Hahn et al.

(10) Patent No.: US 9,105,288 B1
(45) Date of Patent: Aug. 11, 2015

(54) FORMED ELECTRICAL CONTACT PAD FOR USE IN A DUAL STAGE ACTUATED SUSPENSION

(71) Applicant: Magnecomp Corporation, Murrieta, CA (US)

(72) Inventors: Peter Hahn, Ayutthaya (TH); Kuen Chee Ee, Chino, CA (US); Long Zhang, Murrieta, CA (US)

(73) Assignee: MAGNECOMP CORPORATION, Murrieta, CA (US)

( * ) Notice: Subject to any disclaimer, the term of this patent is extended or adjusted under 35 U.S.C. 154(b) by 0 days.

(21) Appl. No.: 14/637,020

(22) Filed: Mar. 3, 2015

Related U.S. Application Data

(60) Provisional application No. 61/951,506, filed on Mar. 11, 2014.

(51) Int. Cl.
   *G11B 5/48* (2006.01)
   *H05K 3/40* (2006.01)

(52) U.S. Cl.
   CPC ............ *G11B 5/4846* (2013.01); *G11B 5/4833* (2013.01); *G11B 5/4853* (2013.01); *G11B 5/4873* (2013.01); *H05K 3/4007* (2013.01)

(58) Field of Classification Search
   USPC .............. 360/245.8, 245.9, 294.3, 294.4, 245, 360/245.3
   See application file for complete search history.

(56) References Cited

U.S. PATENT DOCUMENTS

| 4,633,122 | A | * | 12/1986 | Radice | .......................... 310/339 |
|---|---|---|---|---|---|
| 4,761,699 | A | * | 8/1988 | Ainslie et al. | .............. 360/234.5 |
| 5,245,750 | A | * | 9/1993 | Crumly et al. | ................... 29/840 |
| 5,307,561 | A | * | 5/1994 | Feigenbaum et al. | ........... 29/846 |
| 5,747,358 | A | * | 5/1998 | Gorrell et al. | ..................... 216/11 |
| 6,085,414 | A | * | 7/2000 | Swarbrick et al. | ............... 29/847 |
| 6,164,979 | A |   | 12/2000 | Gillette et al. | |
| 6,166,333 | A | * | 12/2000 | Crumly et al. | ................. 174/255 |
| 6,313,402 | B1 | * | 11/2001 | Schreiber et al. | ............. 174/527 |
| 7,167,344 | B2 | * | 1/2007 | Nakagawa et al. | ......... 360/294.4 |
| 7,374,430 | B2 |   | 5/2008 | Nagawatari | |
| 7,545,246 | B2 | * | 6/2009 | Kim et al. | ........................ 335/78 |
| 7,751,153 | B1 | * | 7/2010 | Kulangara et al. | .......... 360/294.6 |
| 7,785,113 | B2 |   | 8/2010 | Mizoguchi | |
| 7,900,347 | B2 | * | 3/2011 | Rathburn | ......................... 29/831 |
| 8,026,865 | B2 |   | 9/2011 | Chen et al. | |
| 8,085,508 | B2 | * | 12/2011 | Hatch | ......................... 360/294.4 |
| 8,248,735 | B2 | * | 8/2012 | Fujimoto et al. | ........... 360/294.4 |
| 8,339,748 | B2 | * | 12/2012 | Shum et al. | ................. 360/245.8 |
| 8,542,465 | B2 | * | 9/2013 | Liu et al. | ..................... 360/294.4 |
| 8,570,688 | B1 | * | 10/2013 | Hahn et al. | .................. 360/294.4 |
| 8,630,067 | B2 |   | 1/2014 | Ando et al. | |
| 8,717,713 | B1 | * | 5/2014 | Bjorstrom et al. | .......... 360/294.4 |

(Continued)

*Primary Examiner* — Brian Miller
(74) *Attorney, Agent, or Firm* — Intellectual Property Law Offices of Joel Voelzke, APC

(57) ABSTRACT

A flexible electrical circuit such as for use in a hard disk drive dual stage actuated (DSA) suspension has a dimple or other raised feature such as a jog formed in an electrical contact pad. The dimple raises up at least part of the contact pad in height so as to reduce the distance that an electrical bridging component or material such conductive epoxy, solder paste, or jet dispensed solder must traverse in order to complete an electrical connection from the contact pad to an adjacent piezoelectric microactuator or other electrical component for which the electrical circuit carries an electrical signal or electrical power. The reduced distance improves the cleanliness and reliability of the electrical and physical bond, and can allow for electrical connection types that would otherwise be impractical.

20 Claims, 3 Drawing Sheets

(56) References Cited

U.S. PATENT DOCUMENTS

| | | | |
|---|---|---|---|
| 8,773,820 B1 * | 7/2014 | Hahn et al. | 360/294.4 |
| 8,810,972 B1 * | 8/2014 | Dunn | 360/294.4 |
| 8,837,091 B2 * | 9/2014 | Arai | 360/294.4 |
| 8,885,299 B1 * | 11/2014 | Bennin et al. | 360/294.3 |
| 2009/0145641 A1 * | 6/2009 | Daniel et al. | 174/258 |
| 2011/0075301 A1 * | 3/2011 | Tsuchiya et al. | 360/245.3 |

* cited by examiner

FORMED ELECTRICAL CONTACT PAD FOR USE IN A DUAL STAGE ACTUATED SUSPENSION

CROSS-REFERENCE TO RELATED APPLICATIONS

This application claims priority from U.S. provisional patent application No. 61/951,506 dated Mar. 11, 2014.

BACKGROUND OF THE INVENTION

1. Field of the Invention

This invention relates to the field of dual stage actuated (DSA) suspensions for disk drives. More particularly, this invention relates to the field of electrical connections to microactuators on DSA suspensions.

2. Description of Related Art

Magnetic hard disk drives and other types of spinning media drives such as optical disk drives are well known. Disk drive suspensions are the assemblies that hold the read/write head over the correct place on the spinning data disk, in order to write data to, and read data from, the desired data track on the disk.

Both single stage actuated disk drive suspensions and dual stage actuated (DSA) suspension are known. In a single stage actuated suspension, only a voice coil motor moves the disk drive suspension. In a DSA suspension, as for example in U.S. Pat. No. 7,459,835 issued to Mei et al. as well as many others, in addition to the voice coil motor which moves the entire suspension, at least one secondary actuator, often referred to as a microactuator, is located on the suspension in order to effect fine movements of the magnetic head slider to keep it properly aligned over the data track on the spinning disk. The secondary DSA microactuator(s) provide much finer control and much higher bandwidth of the servo control loop than does the voice coil motor alone which effects relatively coarse movements of the suspension and hence the magnetic head slider. Lead zirconium titanate is one of the broadly used intermetallic inorganic compounds possessing piezoelectric properties and is commonly referred to as PZT. PZT devices are often used as the microactuator motor, although other types of microactuator motors are possible. Examples of a dual stage actuated suspension, a PZT microactuator often referred to simply as a PZT for short, and various methods of electrically and mechanically integrating the PZT into the suspension, are disclosed in U.S. Pat. No. 8,570,688 to Hahn, and in copending U.S. patent application Ser. No. 14/045,773, which are owned by the assignee of the present application. Other mechanical and electrical connections have been proposed.

Various structures and methods have been proposed for making the required electrical connections to the PZT microactuators. One structure and method that was developed by the assignee of the present application is shown in FIG. 1, and in FIG. 2 which is a cross sectional view taken of the suspension of FIG. 1 taken along section line 2-2. In this example, suspension 10 includes slider 12 mounted to gimbal 14. The PZT 20 is connected to gimbal 14 through gimbal arms 16. The PZT 20 typically includes PZT material 22, a thin top metalized electrode 24, and thin bottom metalized electrode 26. A flexible circuit 30 typically includes a metal support layer such as stainless steel layer 32, insulating layer such as polyimide layer 34, and a copper signal conductor layer including copper electrical contact pad 37 covered by an anti-corrosion layer 38 such as nickel followed by gold. Anti-corrosion layer 38 will be referred to hereafter simply as gold layer 38. Non-conductive adhesive such as non-conductive epoxy 50 physically attaches PZT 20 to the flexible circuit 30 on one side. For the electrical connection, bottom electrode 26 of PZT 20 is physically and electrically connected to the ground potential of the suspension body by conductive epoxy 18 bonded to grounded suspension body 16 which is stainless steel. The driving voltage potential is provided through conductive epoxy or solder balls 52 that forms a physical and electrical bridge from a copper contact pad 37 and its anti-corrosion layer 38 on the flexible circuit 30 to the metalized top surface of the PZT which defines the top electrode 24.

SUMMARY OF THE INVENTION

The electrical connection of FIGS. 1 and 2 that employs conductive epoxy may be prone to dry joint issues. Using solder paste instead of conductive epoxy might be possible; such a technique, however, is considered less than ideal due to the non-wetting properties of the solder paste on the non-conductive epoxy in FIG. 2. Other potential techniques such as solder jet bonding are at least theoretically possible. In solder jet bonding, tiny balls of molten solder are ejected from a print head and directed to the target using inkjet printing technology. Forming a bridge from the copper signal pad to the PZT top electrode using solder jet technology, however, would require multiple solder dots in order to establish the electrical bridge over the required distance involved and is more prone to fatigue failure.

The present invention provides an improved connection structure and method that reduces the distance from the copper contact pad to the electrode that is the top surface of the PZT. In an exemplary embodiment of the invention, part or all of the electrical contact pad is formed such as by stamping or other techniques to give it a raised profile compared to the part of the suspension that is directly underneath the PZT. In one embodiment, a dimple is stamped into a portion of the flexible circuit that includes the copper contact pad so as to raise at least part of the copper contact pad up to a higher level, namely, a level that is closer to the level of the top of the PZT. In another embodiment, the flexible circuit has a jog or step in it that raises the copper contact pad up to a higher level.

Exemplary embodiments of the invention will be further described below with reference to the drawings, in which like numbers refer to like parts. The drawing figures might not be to scale, and certain components may be shown in generalized or schematic form and identified by commercial designations in the interest of clarity and conciseness.

DETAILED DESCRIPTION OF THE PREFERRED EMBODIMENTS

Figure 1:
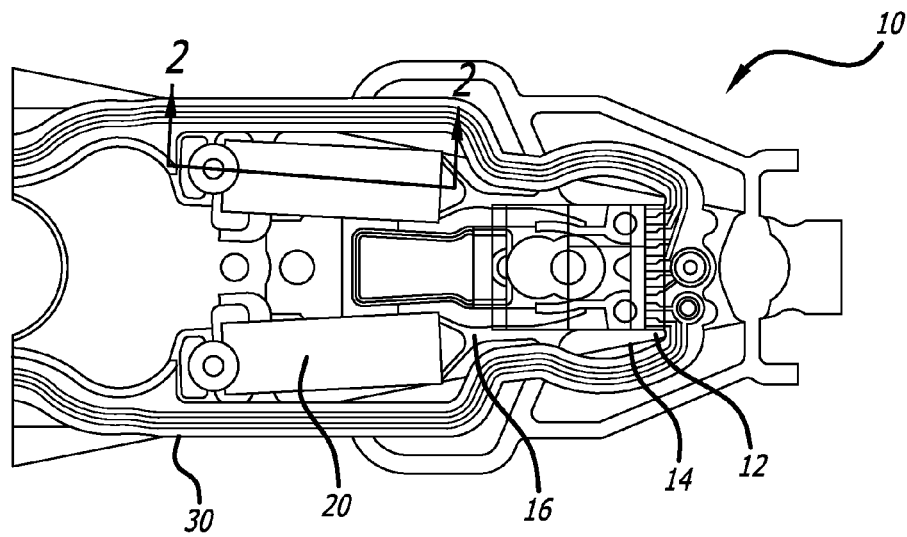
FIG. 1 is a top plan view of a prior PZT electrical connection method.
Figure 2:
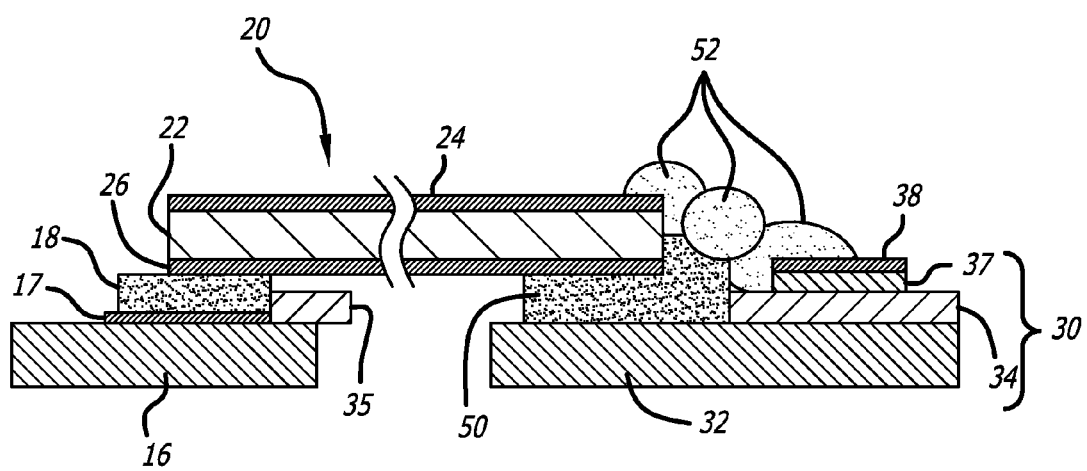
FIG. 2 is a sectional view of the PZT connection of FIG. 1 taken along section line 2-2.
Figure 3:
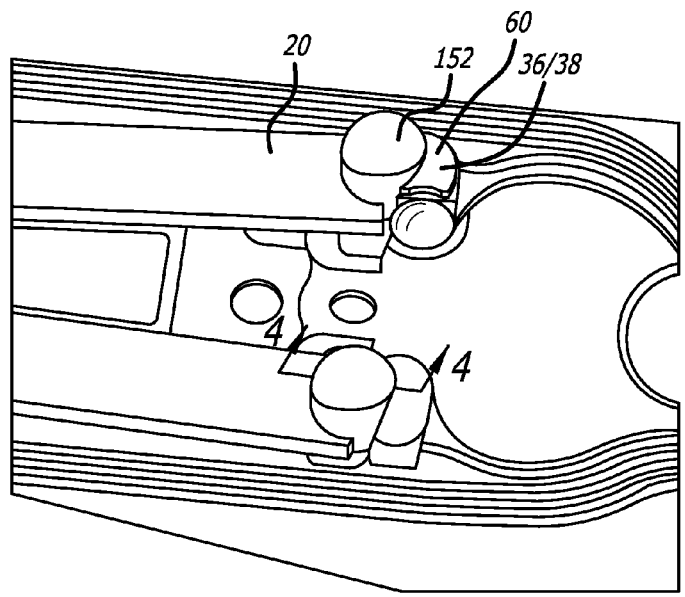
FIG. 3 is a top perspective view of a PZT connection to an electrical contact pad according to a first illustrative embodiment of the invention in which the raised portion defines a curved bump.
Figure 4:
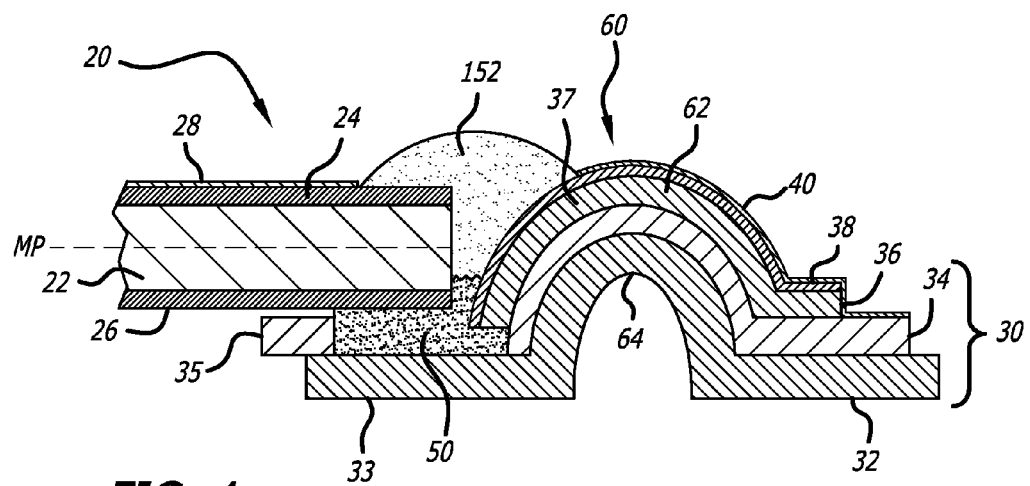
FIG. 4 is a sectional view of the PZT connection of FIG. 3 taken along section line 4-4.

FIG. 3 is a top perspective view of a PZT connection to an electrical contact pad according to a first illustrative embodiment of the invention, and FIG. 4 is a sectional view thereof taken along section line 4-4. The flexible circuit 30 of the suspension includes a support layer 32 such as a stainless steel (SST) substrate, an insulating layer 34 such as polyimide, and a conductive signal-carrying layer 36 such as copper or copper alloy (generally Cu). Most of the copper layer of the flexible circuit is covered by an insulating coverlay 40 such as polyimide in order to prevent corrosion of the copper and to prevent short circuiting. The copper is covered by a protective metal layer 38 such as nickel followed by gold but is otherwise exposed at an area that defines an electrical contact pad 37 and where an electrical connection to the contact pad is to be made. As used herein and in the claims, the contact pad 37 is "exposed" if it is not covered by an electrical insulator, although it may be covered by other electrically conductive layers such as anti-corrosive nickel and/or gold layers, such that it is electrically accessible.

A raised or vertical feature such as a convex curved bump, dimple or dome 60 has been formed in the supporting layer 32 and in the conducting layer 36 and its contact pad 37, thus creating both a supporting layer bump 64 and a conducting layer bump 62 in the flexible circuit, in order to raise at least part of the contact pad 37 up to a higher z-height. At least part of the copper contact pad 37 is therefore raised up to a vertical height that is closer to, or even on the same height as or above, the top metallized surface 24 of the PZT that defines the PZT's top electrode, than it would be in the absence of the vertical feature. Furthermore, at least part of the copper contact pad 37 is therefore raised up to a vertical height that is closer to the top metallized surface of the PZT than it is to the bottom surface or bottom electrode 26 of the PZT. In this embodiment, as in the additional embodiments disclosed herein, the raised part of the copper contact pad 37 can be raised up to: closer to the top electrode 24 of the PZT 20 than to its bottom surface 26; as high as or even higher than the top electrode 24 of the PZT; higher than the unbent portion of the copper signal trace 36 that is adjacent the bump 60; and/or at least as high as a midplane MP of the PZT 20. In all cases, the copper contact pad 37 and its convex surface is effectively raised to higher than it would be, and closer to the top surface and top electrode 26 of the PZT, than it would be in the absence of the vertical feature 60.

An electrically conductive bridge 152 is then established between the PZT's top (positive) electrode or surface 24 and electrical contact pad 37, such as by conductive adhesive 152 such as conductive epoxy, or perhaps some other flowable and subsequently hardened conductive material such as solder paste. The presence of the bump thus reduces the physical and electrical distance that must be traversed by conductive bridge 152 from copper contact pad 37 to the PZT's driven electrode 26 on its top surface.

In the illustrative embodiment a portion 33 of the supporting layer 32 not covered by copper layer 36 extends underneath bottom surface 26 of PZT 20. A section 35 of polyimide layer 34 acts as a dam to help prevent the undesired spread of non-conductive epoxy 50.

The result of the formed and raised structure 60 is that the physical and electrical distance from the PZT's top electrode 24, or more generally the distance from some other electrical component to which an electrical connection is to be established, to the copper contact pad 37 is reduced as compared to what that distance would be in the absence of the formed vertical feature. This reduction in distance has several advantages. First, less bridging material is needed, whether that bridging material is conductive epoxy or any other material. Second, the distance that the bridging material must traverse over the non-conductive epoxy, which is relatively non-wetting, is reduced, and at the same time the surface area of the bridging material on the more wetting copper contact pad is increased, thus strengthening the resulting bond. Third, because the distance that must be bridged is reduced, and because the distance that must be bridged over the relatively non-wetting non-conductive epoxy is significantly reduced, the conductive epoxy 152 can now be replaced by materials that have better manufacturing process characteristics such as solder paste or solder jet bonding. Solder paste and solder jet bonding are generally superior to non-conductive epoxy at least for the reasons that those materials are more easily dispensed, harden much more quickly, and do not require elevated temperatures for hardening. Elevated temperatures such as used for epoxy hardening can have negative effects on other components of the suspension including the PZT and its poling.

The invention provides the additional advantage that a dimpled or otherwise raised contact pad acts as an effective dam against undesired spreading of the bridging material to the right in FIG. 4, whether that bridging material is conductive epoxy, solder paste, or other material.

In another feature of the invention, a patterned mask of insulating material such as polyimide can be formed on a portion of the top surface of the PZT and/or the copper contact pad. The patterned mask of insulating material defines a top insulating layer that acts as a dam against undesired spread and smearing of the solder or other bridging material over the PZT and/or the copper contact pad. On the bumped contact pad 37, polyimide coverlay 40 acts as a dam to help prevent the unwanted spread of conductive epoxy 152 over the flexible circuit. On the PZT 20, polyimide layer 28 acts as a dam to prevent unwanted spread of conductive epoxy 152 over the PZT.

Figure 5:
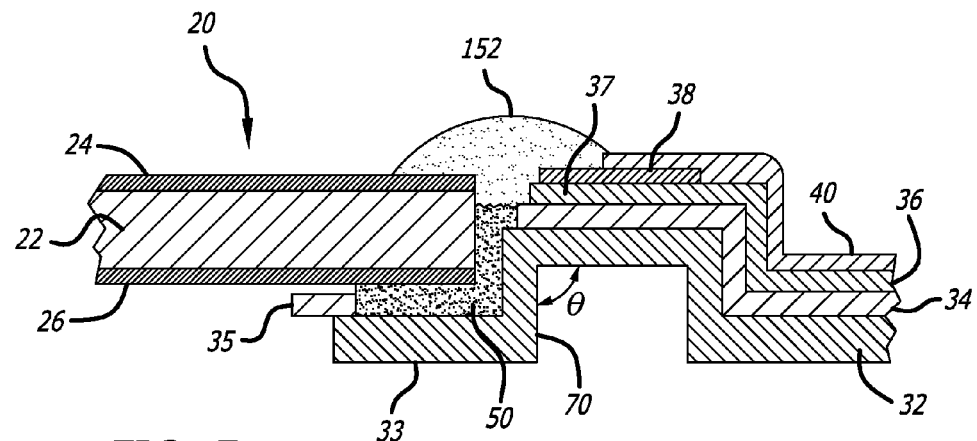
FIG. 5 is a cross sectional view of an additional illustrative embodiment of the invention in which the raised portion defines a jog.

FIG. 5 is a cross sectional view of an additional illustrative embodiment of the invention in which the raised portion defines a jog. In this embodiment the copper contact pad 37 including its protective nickel/gold layer 38 (if present) is raised up in z-height by a jog or step 70 that is formed in the flexible circuit including the SST support layer 32 and the copper conducting layer 36. Such a jog structure could provide additional physical support for the copper contact pad during the soldering operation by acting as a stiffening rib. The jog can be in either the x-direction (the longitudinal direction of the suspension) or the y-direction (the lateral direction of the suspension), but preferably the cross-section exhibits a jog of approximately 0=90°, with the circuit having two approximately 90° individual bends as seen in the figure. More precisely, the figure shows four 90° bends in the circuit. More generally, the jogs could have angles of 70°-110°, or other angles.

Figure 6:
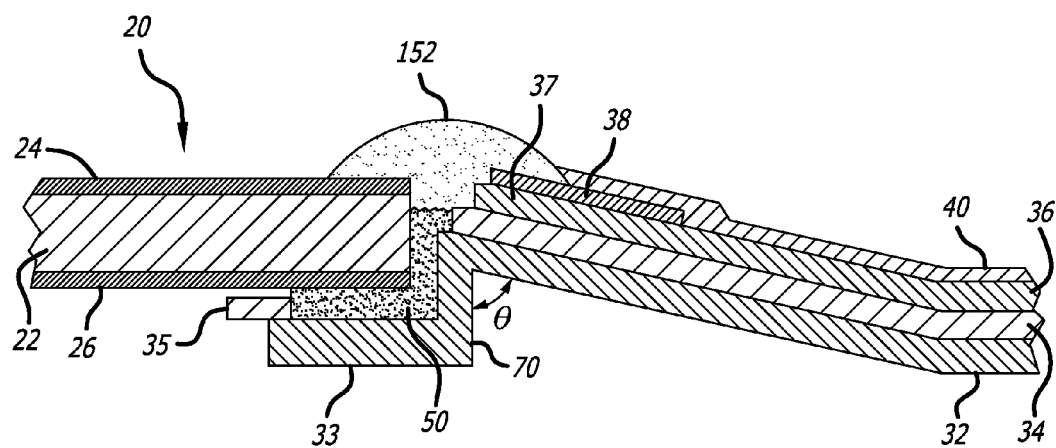
FIG. 6 is a cross sectional view of an additional illustrative embodiment of the invention in which the raised portion includes one acute angle.

FIG. 6 is a cross sectional view of an additional illustrative embodiment of the invention in which the raised portion includes one 90° bend and one acute bend angle 0<90°. More generally, the raised feature could have one bend angle of between 70° and 110°, and one bend having an acute angle, that is, less than 90°.

Although the invention has been described with reference to piezoelectric microactuators which are a type of transducer, it will be appreciated that the invention is applicable more generally to other types of microactuators, and indeed more generally still to making electrical connections to various types of electronic components other than just microactuators including but not limited to other transducers, sensors, heaters, and in environments other than disk drives and suspension assemblies for disk drives.

It will be understood that the terms "generally," "approximately," "about," "substantially," and "coplanar" as used within the specification and the claims herein allow for a certain amount of variation from any exact dimensions, measurements, and arrangements, and that those terms should be understood within the context of the description and operation of the invention as disclosed herein.

It will further be understood that terms such as "top," "bottom," "above," and "below" as used within the specification and the claims herein are terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

We claim:

1. A dual stage actuated suspension for a disk drive, the suspension including:
   a microactuator having a bottom surface and a top surface, the top surface including an electrode thereon; and
   a circuit comprising a support layer and a conductive layer thereon, the conductive layer including an electrical contact pad;
   wherein:
   a first part of the support layer extends underneath the microactuator;
   a second part of the support layer has a vertical feature formed therein such that at least a portion of the support layer and conductive layer near the microactuator are raised up above the first part of the support layer underneath the microactuator, and such that the electrical contact pad is raised to a vertical level that is closer to the top surface of the microactuator than in the absence of said vertical feature; and
   an electrical connection extends from the electrical contact pad to the electrode on the top surface of the microactuator;
   whereby a distance that is bridged by the electrical connection is reduced as compared to a suspension lacking said vertical feature in the support layer.

2. The dual stage actuated suspension of claim 1 wherein the vertical feature is a dimple.

3. The dual stage actuated suspension of claim 1 wherein the vertical feature comprises a jog.

4. The dual stage actuated suspension of claim 3 wherein the jog is a 90° jog.

5. The dual stage actuated suspension of claim 3 wherein the vertical feature comprises one bend having an angle of between 70° and 110°, and one bend having an angle of less than 90°.

6. The dual stage actuated suspension of claim 1 wherein the electrical connection comprises solder paste.

7. The dual stage actuated suspension of claim 1 wherein the electrical connection comprises a plurality of solder balls that were deposited using a solder jet process.

8. The dual stage actuated suspension of claim 1 wherein at least a portion of the electrical contact pad is at a vertical level that is closer to the top surface of the microactuator than to the bottom surface of the microactuator.

9. The dual stage actuated suspension of claim 1 wherein at least a portion of the electrical contact pad is raised by said formed feature to a vertical level that is at least as high as the top surface of the microactuator.

10. The dual stage actuated suspension of claim 1 further comprising a top insulting layer over a portion of the top surface of the microactuator, the top insulating layer acting as a dam to contain material that comprises the electrical connection.

11. The dual stage actuated suspension of claim 1 further comprising a top insulting layer over a portion of the electrical contact pad, the top insulating layer acting as a dam to contain material that comprises the electrical connection.

12. A dual stage actuated suspension for a disk drive, the suspension including:
    a flexible circuit comprising:
       a copper signal trace covered by an insulating layer; and
       an exposed copper contact pad adjacent the covered copper signal trace;
    the flexible circuit having a bent portion formed therein that raises at least a portion of the copper contact pad to a vertical height that is higher than a portion of the copper signal trace that is adjacent to the bent portion, said portion of the copper contact pad that is raised up defining a raised contact pad portion; and
    a conductor that is not the copper contact pad extending from the raised contact pad portion to an electrical component.

13. The dual stage actuated suspension of claim 12 wherein the conductor comprises solder that has been dispensed in molten form through a nozzle onto the suspension.

14. The dual stage actuated suspension of claim 12 wherein the electrical component is a piezoelectric microactuator.

15. The dual stage actuated suspension of claim 14 wherein the raised contact pad portion is disposed at a height that is at least equal to a mid height of the microactuator.

16. The dual stage actuated suspension of claim 12 wherein said conductor constitutes a flowable and hardened conductor, and said raised contact pad portion reduces a path length of the conductor from the raised contact pad portion to the electrical component to a shorter distance than said path length would be in the absence of said bent portion in the flexible circuit.

17. A flexible circuit, the flexible circuit comprising:
    a copper signal trace covered by an insulating layer; and
    an exposed copper contact pad adjacent the covered copper signal trace;
    wherein the flexible circuit has a feature formed therein that raises at least a portion of the copper contact pad to a vertical height that is higher than a portion of the copper signal trace that is adjacent the formed feature, said portion of the copper contact pad that is raised up defining a raised contact pad portion; and a conductor that is not the copper contact pad, the conductor extending from the raised contact pad portion to an adjacent transducer.

18. The flexible circuit of claim 17 wherein said formed feature comprises a curved bump, the curved bump defining a convex surface of the raised contact pad portion, the conductor making physical and electrical contact to the convex surface of the raised contact pad portion.

19. The flexible circuit of claim 18 wherein said transducer is a piezoelectric motor.

20. The flexible circuit of claim 19 wherein said electrical conductor is a bridge of flowable conductive material, and the bridge has a length that is less than a height of the piezoelectric transducer.

* * * * *